(12) United States Patent
Chen et al.

(10) Patent No.: US 7,554,408 B2
(45) Date of Patent: Jun. 30, 2009

(54) APPARATUS AND METHOD FOR ASYMMETRIC CHARGE PUMP FOR AN AUDIO AMPLIFIER

(75) Inventors: Huaijin Chen, Los Gatos, CA (US);
Marcellus Chen, Fremont, CA (US);
Ansuya P. Bhatt, Cupertino, CA (US);
Raminder Jit Singh, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 74 days.

(21) Appl. No.: 11/751,502

(22) Filed: May 21, 2007

(65) Prior Publication Data

US 2008/0290949 A1    Nov. 27, 2008

(51) Int. Cl.
*H03F 3/04* (2006.01)
(52) U.S. Cl. ...................................... 330/297
(58) Field of Classification Search ............... 330/127, 330/297; 327/536, 537
See application file for complete search history.

(56) References Cited

U.S. PATENT DOCUMENTS 6,636,104 B2    10/2003   Henry
6,922,097 B2 *   7/2005   Chan et al. ............... 327/536
2003/0138112 A1   7/2003   Doy
2005/0024962 A1   2/2005   Chan et al.
2007/0159557 A1*  7/2007   Nakakita et al. ........... 348/707

OTHER PUBLICATIONS

MAX1673, MAXIM: Regulated, 125mA-Output Charge-Pump DC-DC Inverter, Maxim Integrated Products, USA, Jan. 1998, 8 pgs.
LM4911, "Stereo 40mW Low Noise Headphone Amplifier with Selectable Capacitive Coupled or OCL Output," National Semiconductor Corporation, Feb. 2003, 22 pgs.
LM4920, "Ground-Referenced, Ultra Low Noise, Fixed Gain, 80mW Stereo Headphone Amplifier," National Semiconductor Corporation, Oct. 2006, 17 pgs.
LM4922. "Ground-Referenced, Ultra Low Noise, Fixed Gain, 80mW Stereo Headphone Amplifier," National Semiconductor Corporation, Oct. 2006, 21 pgs.
LM4926, "Ground-Referenced, Ultra Low Noise, Fixed Gain, 80mW Stereo Headphone Amplifier," National Semiconductor Corporation, Jun. 2005, 22 pgs.

* cited by examiner

*Primary Examiner*—Steven J Mottola
(74) *Attorney, Agent, or Firm*—Darby & Darby PC; Matthew M. Gaffney

(57) ABSTRACT

An audio amplifier with an integrated asymmetric charge pump is provided. The audio amplifier receives VDD and VSS as power supply signals. The integrated charge pump is arranged to provide VSS from VDD, such that VSS is a negative voltage that is lower in magnitude than VDD.

19 Claims, 5 Drawing Sheets

FIG. 5C VrefP-VrefN
FIG. 5D VP-VN

US 7,554,408 B2

APPARATUS AND METHOD FOR ASYMMETRIC CHARGE PUMP FOR AN AUDIO AMPLIFIER

FIELD OF THE INVENTION

The invention is related to power converters, and in particular but not exclusively, to an asymmetric charge pump that provides VSS for an audio amplifier such that VSS is a negative voltage.

BACKGROUND OF THE INVENTION

An audio amplifier is a power amplifier that may be used to amplify low-power audio signals (e.g. 20 Hz-20 KHz signals) for driving a speaker load. The speaker load value typically varies from 4 ohm to 32 ohm. Audio amplifiers may be used to drive loudspeakers, but may also be used for driving other types of speaker loads such as audio headphones and earpieces. Traditionally, audio amplifiers are class AB amplifiers. However, other types of amplifiers, such as class D amplifiers, may also be employed.

BRIEF DESCRIPTION OF THE DRAWINGS

Non-limiting and non-exhaustive embodiments of the present invention are described with reference to the following drawings, in which:

FIGS. 5A-5F show a block diagrams of waveforms of embodiments of signals for an embodiment of the charge pump of FIG. 4, in accordance with aspects of the present invention.

DETAILED DESCRIPTION

Figure 1:
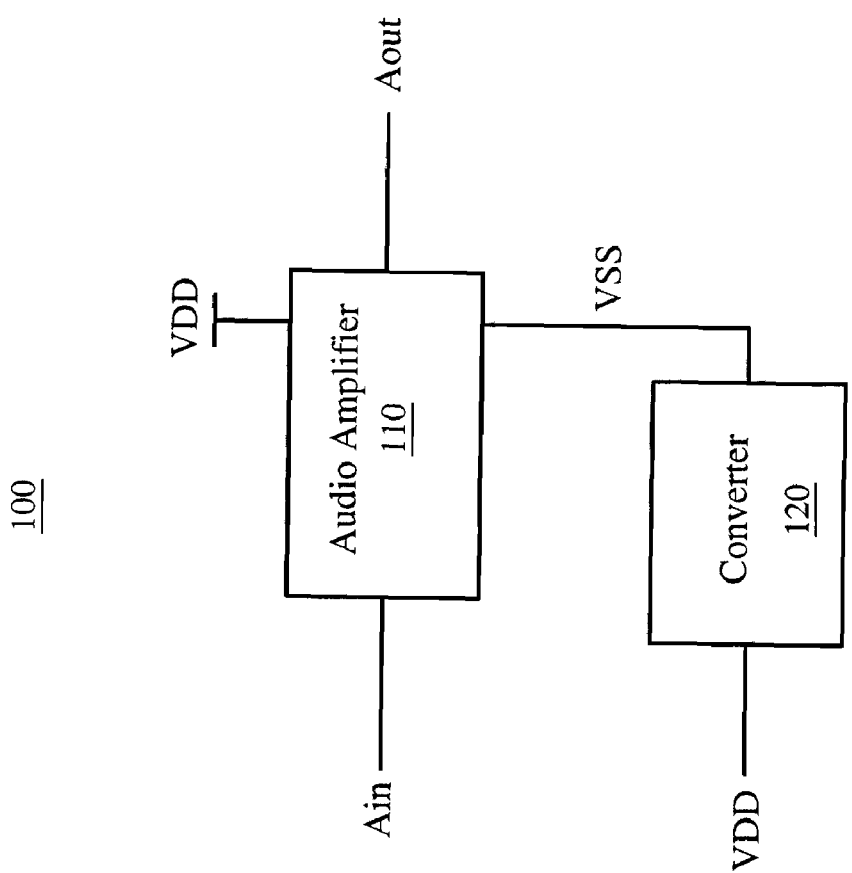
FIG. 1 shows a block diagram of an embodiment of a circuit including an audio amplifier and a converter.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" includes plural reference, and the meaning of "in" includes "in" and "on." The phrase "in one embodiment," as used herein does not necessarily refer to the same embodiment, although it may. As used herein, the term "or" is an inclusive "or" operator, and is equivalent to the term "and/or," unless the context clearly dictates otherwise. The term "based, in part, on", "based, at least in part, on", or "based on" is not exclusive and allows for being based on additional factors not described, unless the context clearly dictates otherwise. The term "coupled" means at least either a direct electrical connection between the items connected, or an indirect connection through one or more passive or active intermediary devices. The term "circuit" means at least either a single component or a multiplicity of components, either active and/or passive, that are coupled together to provide a desired function. The term "signal" means at least one current, voltage, charge, temperature, data, or other signal. Where either a field effect transistor (FET) or a bipolar junction transistor (BJT) may be employed as an embodiment of a transistor, the scope of the words "gate", "drain", and "source" includes "base", "collector", and "emitter", respectively, and vice versa.

Briefly stated, the invention is related to an audio amplifier with an integrated asymmetric charge pump. The audio amplifier receives VDD and VSS as power supply signals. The integrated charge pump is arranged to provide VSS from VDD, such that VSS is a negative voltage that is lower in magnitude than VDD.

FIG. 1 shows a block diagram of an embodiment of circuit 100. Circuit 100 includes converter 120 and audio amplifier 110. Audio amplifier 110 is arranged to receive audio amplifier input signal Ain, and to provide audio amplifier output signal Aout for driving a speaker load (not shown in FIG. 1). Signal Ain is based, at least in part, on an audio input signal. In one embodiment, signals Ain and Aout are both single-ended signals. In other embodiments, one or both of signals Ain and Aout are differential signals.

Audio amplifier 110 is arranged to receive positive power supply signal VDD as an upper power supply input and negative power supply signal VSS as a lower power supply input. Converter 120 is arranged to provide voltage VSS from voltage VDD such that the polarity of VSS is the opposite of the polarity of VDD (e.g. VSS is negative while VDD is positive). For example, in embodiment, VDD is 5V and VSS is −3V. In other embodiments, other values of VDD and VSS may be employed. In some embodiments, VSS is adjustable, but there is a limit to VSS such that VDD−VSS>Vlimit, where Vlimit is a pre-defined value that is less than 2*VDD. In one embodiment, converter 120 is an inverting DC-DC power converter.

Figure 2:
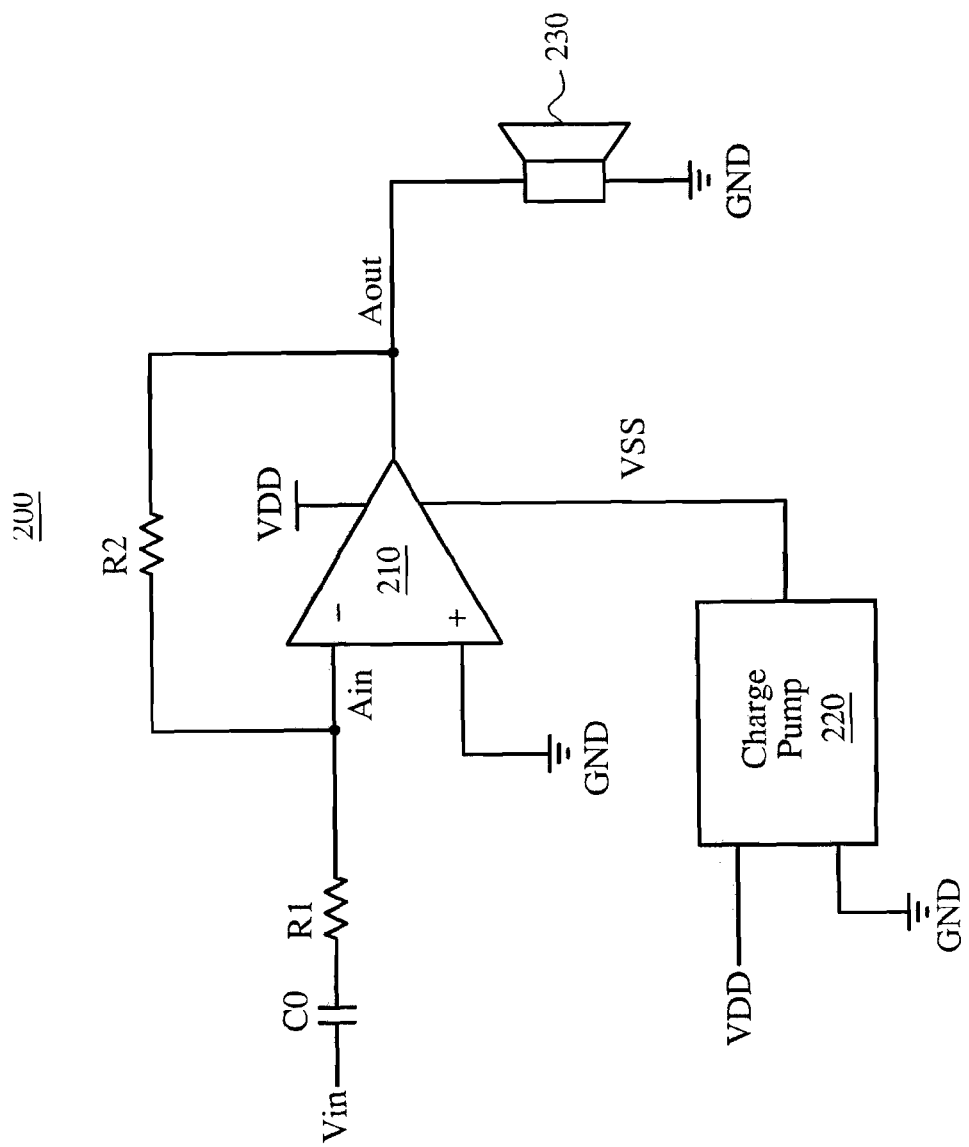
FIG. 2 illustrates a block diagram of an embodiment of the circuit of FIG. 1.

FIG. 2 illustrates a block diagram of an embodiment circuit 200, which may be employed as an embodiment of circuit 100 of FIG. 1. Charge pump 220 is an embodiment of converter 120 of FIG. 1. In the embodiment shown, circuit 200 further includes capacitor C0, resistors R1 and R2, and speaker load 230.

Audio amplifier 210 has an inverting input that is arranged to receive audio amplifier input signal Ain, a noninverting input coupled to ground (GND), a positive power supply input that is arranged to receive voltage VDD, a negative power supply input that is arranged to receive signal VSS, and an output that is arranged to provide audio amplifier output signal Aout. Audio amplifier signal Ain is based on audio signal Vin (which is the input audio signal to be amplified).

Figure 3:
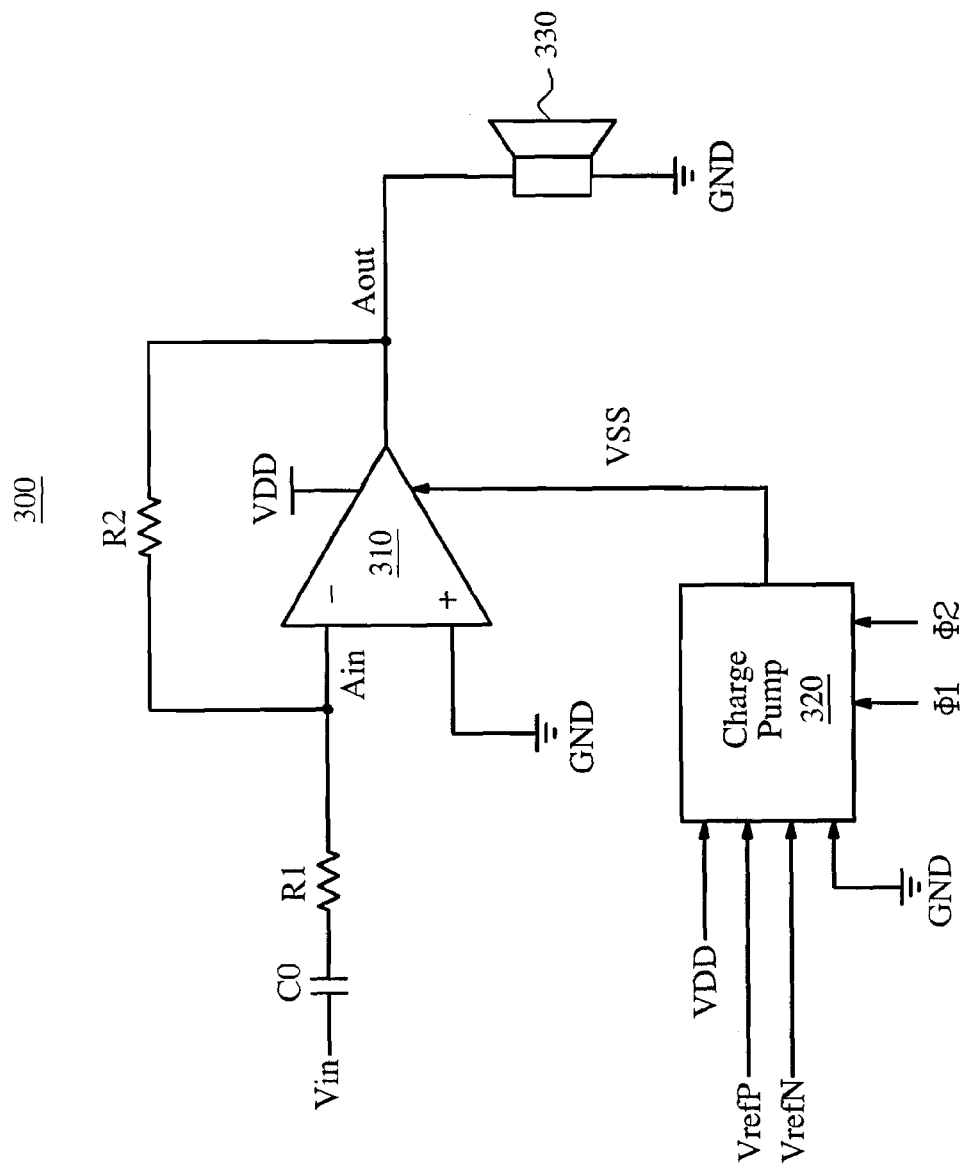
FIG. 3 shows a block diagram of an embodiment of the circuit of FIG. 2.

FIG. 3 shows a block diagram of an embodiment of circuit 300, which may be employed as an embodiment of circuit 200 of FIG. 2.

Charge pump 320 is arranged to receive signals VDD, VrefP, VrefN, GND, φ1, and φ2, and to provide voltage VSS. Vref is a differential reference voltage VrefP−VrefN. Signals φ1 and φ2 are non-overlapping clock signals having substantially the same frequency as each other. Further, charge pump 320 is arranged to provide voltage VSS such that VSS=−(VrefP−VrefN).

In one embodiment, VrefP and VrefN are pre-determined values that are not user-adjustable. In other embodiments, VrefP and VrefN are user-adjustable so that users may adjust the value to which voltage VSS is regulated. In one embodiment, voltage VDD is 5V, and VrefP−VrefN=3V (so that VSS=−3V in steady state). In another embodiment, voltage VDD=5V, and VrefP−VrefN is user-adjustable anywhere from 2V to 3V (so that VSS is adjustable from −2V to −3V in steady state). In other embodiments, other values may be employed.

Circuit 300 does not require an output capacitor like CCO (Capacitor Coupled Output) audio amplifiers, and does not risk shorting to ground like technologies that use a VDD/2 buffer. Furthermore, circuit 300 allows a process with a lower breakdown voltage. For example, with VDD=5V, if a symmetric charge pump were used to provide VSS=−5V, a process voltage with a breakdown voltage of 8V could not be used, because there is a total voltage swing of 10V between VDD and VSS. However, by using an asymmetric charge pump with a pre-defined VSS, or a VSS that is adjustable but in which VDD−VSS does not exceed a pre-defined limit (e.g. VSS no less then −3V for an 8V process), a lower breakdown voltage process may be suitably employed, so that a lower breakdown voltage process may be used which may reduce fabrication cost and provide better performance by using a smaller geometry process. Circuit 300 does not require an output capacitor for the audio amplifier, does not require a VDD/2 buffer, and allows for a smaller geometry process and/or a higher VDD.

In some embodiments, speaker load 330 is an audio headphone or an earpiece. In one embodiment, charge pump 320 is integrated with audio amplifier 310 so that charge pump 320 and audio amplifier 310 are both included on the same integrated circuit (IC).

Figure 4:
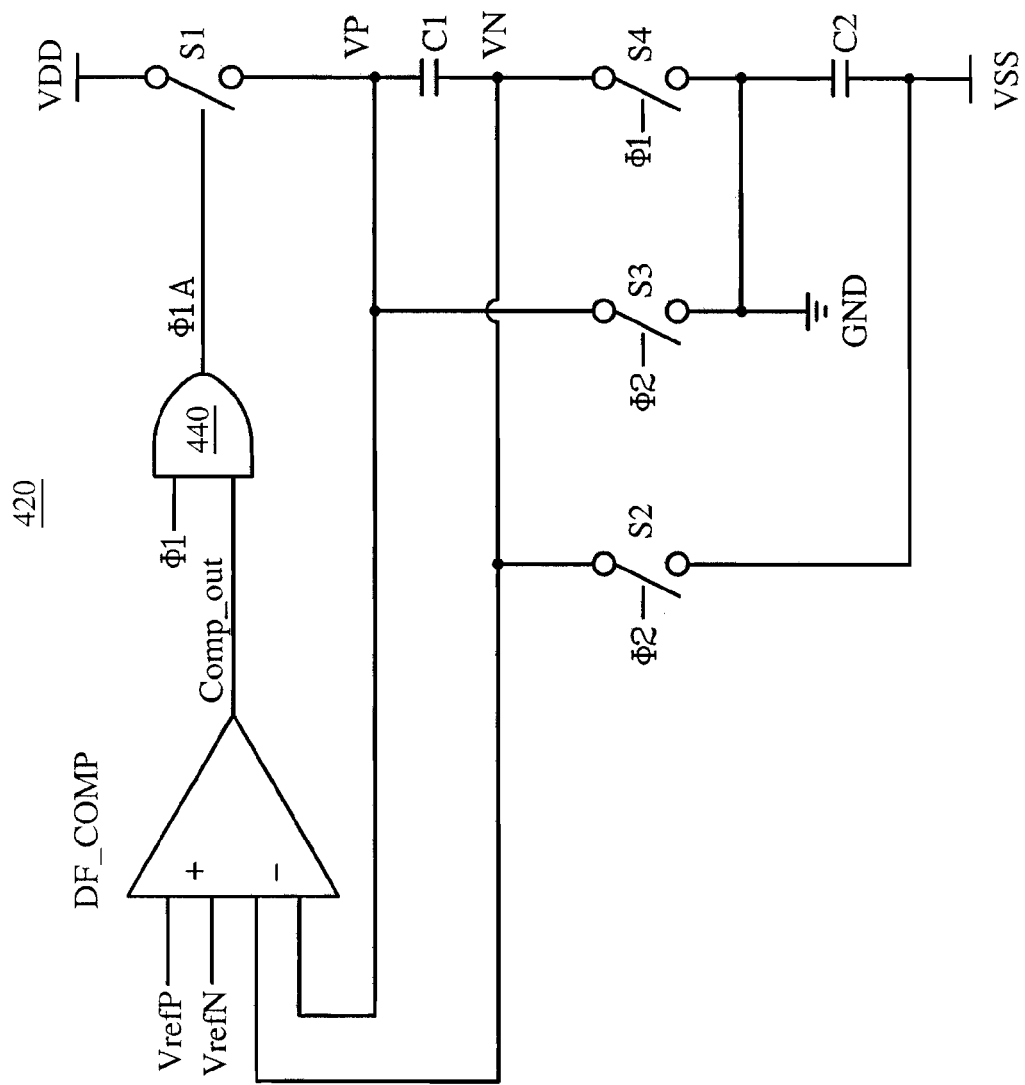
FIG. 4 illustrates a block diagram of an embodiment of the charge pump of FIG. 3.
Figures 5A, 5B, 5E, 5F:
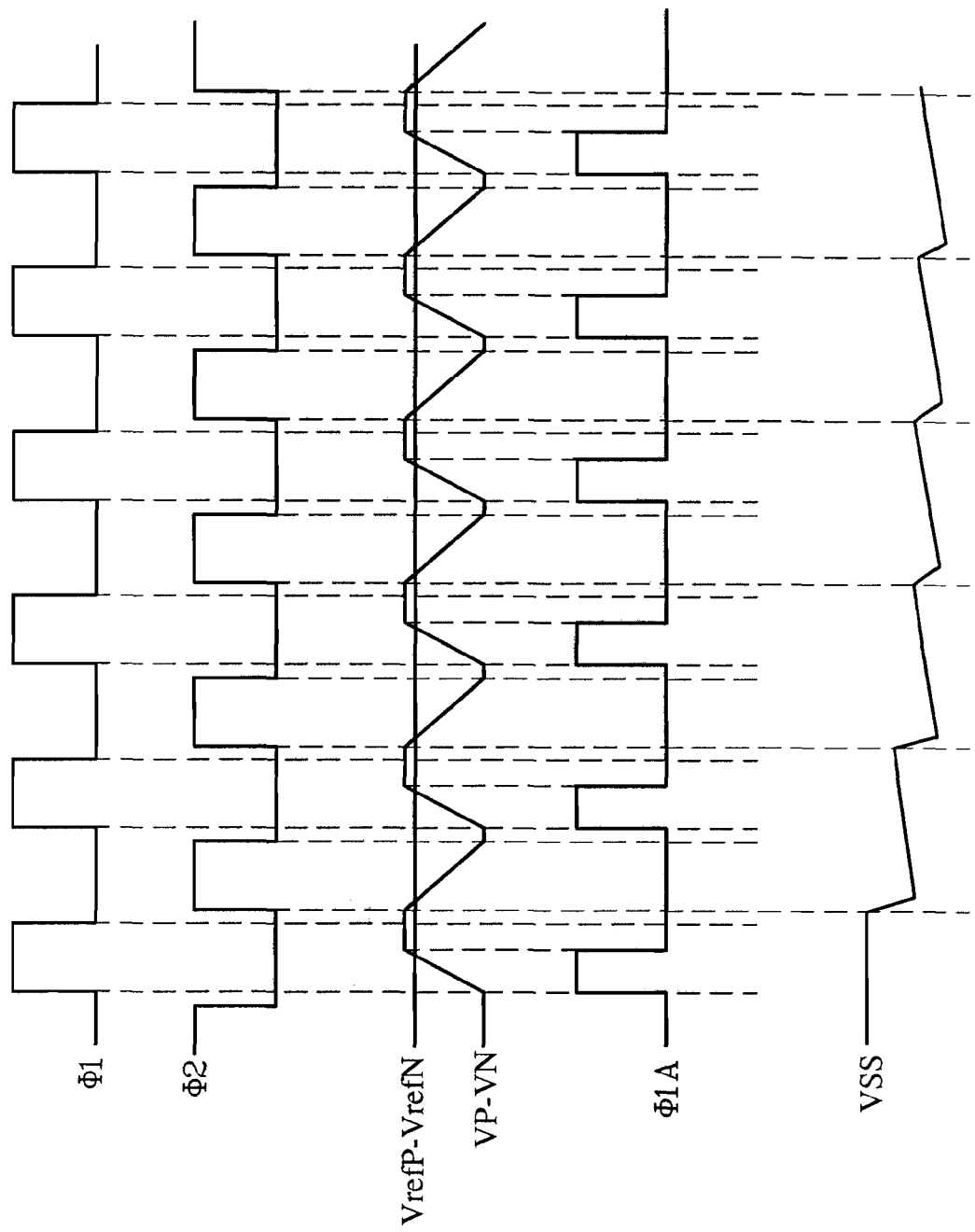

FIG. 4 illustrates a block diagram of an embodiment of charge pump 420, which may be employed as an embodiment of charge pump 320 of FIG. 3. As previously discussed, power supply voltage VDD is received at the input of charge pump 420, and negative power supply voltage VSS is provided at the output of charge pump 420. Charge pump 420 includes comparator DF_COMP, AND gate 440, switches S1-S4, capacitor C1, and capacitor C2.

AND gate 440 is arranged to provide clock signal φ1A from clock signal φ1 and comparator output signal Comp_out. Also, switch S1 is arranged to be open when signal φ1A is low and closed when signal φ1A is high. Switches S2 and S3 are arranged to be open when clock signal φ2 is low and closed when clock signal φ2 is high. Conversely, Switch S4 is arranged to be open when clock signal φ1 is low and closed when clock signal φ1 is high. Comparator DF_COMP is arranged to provide comparator output signal Comp_out such that signal Comp_out is high when VrefP−VrefN>VP−VN, and such that signal Comp_out is low when VrefP−VrefN<VP−VN.

An embodiment of charge pump 420 may be more easily understood in conjunction with FIGS. 5A-5F.

FIGS. 5A-5F show a block diagrams of waveforms of embodiments of signals φ1, φ2, VrefP−VrefN, VP−VN, φ1A, and VSS, respectively, for an embodiment of charge pump 420 of FIG. 4.

Initially, the voltage across capacitor C1 is less than the differential reference voltage, i.e. VP−VN<VrefP−VrefN. At this point, signal Comp_out is high. When φ1 goes high and φ2 is low, φ1A also goes high. Accordingly, switches S1 and S4 turn on and switches S2 and S3 turn off. Accordingly, VDD begins to charge capacitor C1 through switch S1. During charging, when VP−VN>VrefP−VrefN, signal Comp_out goes low. Accordingly, φ1A also goes low, turning off switch S1, which prevents capacitor C1 from charging any further.

When φ1 goes low and φ2 goes high, switches S1, S4 are off and switches S2, S3 are on. During this cycle, capacitor C1 is connected in parallel to C2. Accordingly, voltage VSS moves towards the negative voltage −(VrefP−VrefN). At steady state, VSS is regulated at approximately −(VrefP−VrefN).

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. A circuit for audio amplification, comprising:
    an audio amplifier having at least a first input, a second input, a VDD input, a VSS input, and an output, wherein the audio amplifier is arranged to receive an audio signal at the first input of the audio amplifier, to receive a first power supply signal at the VDD input, and to drive a speaker load at the output of the audio amplifier, wherein the audio amplifier has a process voltage with a breakdown voltage; and
    a converter having at least: an output that is coupled to the VSS input of the audio amplifier, and an input, wherein the converter is arranged to receive the first power supply signal at the input of the converter, and to provide a negative supply voltage at the output of the converter such that the negative supply voltage has the opposite polarity of the first supply voltage and a lesser magnitude than the first supply voltage, wherein double the first supply voltage is greater than the breakdown voltage, and such that the negative supply voltage is sufficiently smaller than in magnitude than the first supply voltage that the first supply voltage minus the negative power supply voltage is less than the breakdown voltage.

2. The circuit of claim 1, wherein the converter is arranged to provide the negative supply voltage such that the negative supply voltage is regulated to a voltage level that is adjustable.

3. The circuit of claim 1, wherein the converter is an inverting DC-DC voltage converter.

4. The circuit of claim 1, wherein the audio amplifier is arranged to drive an audio headphone speaker load or an earpiece speaker load.

5. The circuit of claim 1, wherein no output capacitor is required for operation of the audio amplifier.

6. The circuit of claim 1, wherein the converter is an asymmetric charge pump.

7. A circuit for audio amplification, comprising:
    an audio amplifier having at least a first input, a second input, a VDD input, a VSS input, and an output, wherein the audio amplifier is arranged to receive an audio signal at the first input of the audio amplifier, to receive a first power supply signal at the VDD input, and to drive a speaker load at the output of the audio amplifier; and
    a converter having at least: an output that is coupled to the VSS input of the audio amplifier, and an input, wherein the converter is arranged to receive the first power supply signal at the input of the converter, and to provide a negative supply voltage at the output of the converter such that the negative supply voltage has the opposite polarity of the first supply voltage and a lesser magnitude than the first supply voltage, wherein the converter is an asymmetric charge pump, and, wherein the asymmetric charge pump further has at least a first reference input and a second reference input; the asymmetric charge pump is arranged to receive a first half of a differential reference voltage at the first reference input, and a second half of the differential reference voltage at the second reference input; and wherein the asymmetric charge pump is arranged to provide the negative supply voltage such that the negative supply voltage is regulated to a voltage that is approximately equal in magnitude to the differential reference voltage.

8. A circuit for audio amplification, comprising:
an audio amplifier having at least a first input, a second input, a VDD input, a VSS input, and an output, wherein the audio amplifier is arranged to receive an audio signal at the first input of the audio amplifier, to receive a first power supply signal at the VDD input, and to drive a speaker load at the output of the audio amplifier; and
a converter having at least: an output that is coupled to the VSS input of the audio amplifier, and an input, wherein the converter is arranged to receive the first power supply signal at the input of the converter, and to provide a negative supply voltage at the output of the converter such that the negative supply voltage has the opposite polarity of the first supply voltage and a lesser magnitude than the first supply voltage, wherein the converter is an asymmetric charge pump, and, wherein the asymmetric charge pump includes a differential comparator that is arranged to compare a voltage across a first capacitor with a differential reference voltage.

9. The circuit of claim 8, wherein the asymmetric charge pump further includes a plurality of switches that are arranged to be controlled by non-overlapping clock signals.

10. The circuit of claim 8, wherein the asymmetric charge pump is arranged to receive non-overlapping clock signals that define a plurality of clock cycles that each have a first half of the clock cycle and a second half of the clock cycle, wherein the asymmetric charge pump is arranged to charge the first capacitor during the first half of the clock cycle while the voltage across the first capacitor is less than the differential reference voltage, and to cease charging the first capacitor if the voltage across the first capacitor reaches the differential reference voltage.

11. A circuit for audio amplification, comprising:
an audio amplifier having at least a first input, a second input, a VDD input, a VSS input, and an output, wherein the audio amplifier is arranged to receive an audio signal at the first input of the audio amplifier, to receive a first power supply signal at the VDD input, and to drive a speaker load at the output of the audio amplifier; and
a converter having at least: an output that is coupled to the VSS input of the audio amplifier, and an input, wherein the converter is arranged to receive the first power supply signal at the input of the converter, and to provide a negative supply voltage at the output of the converter such that the negative supply voltage has the opposite polarity of the first supply voltage and a lesser magnitude than the first supply voltage, wherein the converter is an asymmetric charge pump, and, wherein the asymmetric charge pump includes:
a differential comparator having at least a first input, a second input, a third input, a fourth input, and an output;
a logic gate having at least a first input, a second input, and an output, wherein the second input of the logic gate is coupled to the output of the differential comparator;
a first switch that is coupled between the input of the converter and the fourth input of the differential comparator, wherein the first switch has a control input that is coupled to the output of the logic gate;
a first capacitor that is coupled between the fourth input of the differential comparator and the third input of the differential comparator;
a second switch that is coupled between the third input of the differential comparator and the output of the converter, wherein the second switch has a control input;
a third switch that is coupled between the fourth input of the differential comparator and a ground node, wherein the third switch has a control input;
a fourth switch that is coupled between the third input of the differential comparator and the ground node; and
a second capacitor that is coupled between the ground node and the output of the converter.

12. The circuit. of claim 11, wherein
the differential comparator is arranged to receive a first half of a differential reference voltage at the first input of the differential comparator, and to receive a second half of the differential voltage at the second input of the differential comparator;
the differential comparator is arranged to provide a comparator output signal at the output of the differential comparator such that the comparator output signal is asserted if a voltage across the first capacitor reaches the differential reference voltage, and unasserted otherwise;
the logic gate is arranged to receive a first clock signal at the first input of the logic gate;
the second switch is arranged to receive a second clock signal at the control input of the second switch, wherein the first clock signal and the second clock signal are non-overlapping clock signals, and wherein the second clock signal has a frequency that is substantially the same as a frequency of the first clock signal;
the third switch is arranged to receive the second clock signal at the control input of the third switch; and
wherein the fourth switch is arranged to receive the first clock signal at the control input of the fourth switch.

13. A circuit for audio amplification, comprising:
an audio amplifier having at least a first input, a second input, a VDD input, a VSS input, and an output, wherein the audio amplifier is arranged to receive an audio signal at the first input of the audio amplifier, to receive a first power supply signal at the VDD input, and to drive a speaker load at the output of the audio amplifier; and
an asymmetric charge pump integrated with the audio amplifier, wherein the asymmetric charge pump has at least: an output that is coupled to the VSS input of the audio amplifier, and an input, wherein the converter is arranged to receive the first power supply signal at the input of the asymmetric charge pump, and to provide a negative supply voltage at the output of the asymmetric charge pump such that the negative supply voltage has the opposite polarity of the first supply voltage and a lesser magnitude than the first supply voltage, wherein the asymmetric charge pump further has at least a first reference input and a second reference input; the asymmetric charge pump is arranged to receive a first half of a differential reference voltage at the first reference input, and a second half of the differential reference voltage at the second reference input; and wherein the asymmetric charge pump is arranged to provide the negative supply voltage such that the negative supply voltage is regulated to a voltage that is approximately equal in magnitude to the differential reference voltage.

14. The circuit of claim 13, wherein the asymmetric charge pump includes:
a differential comparator having at least a first input, a second input, a third input, a fourth input, and an output;
a logic gate having at least a first input, a second input, and an output, wherein the second input of the logic gate is coupled to the output of the differential comparator;

a first switch that is coupled between the input of the converter and the fourth input of the differential comparator, wherein the first switch has a control input that is coupled to the output of the logic gate;

a first capacitor that is coupled between the fourth input of the differential comparator and the third input of the differential comparator;

a second switch that is coupled between the third input of the comparator and the output of the asymmetric charge pump, wherein the second switch has a control input;

a third switch that is coupled between the fourth input of the differential comparator and a ground node, wherein the third switch has a control input;

a fourth switch that is coupled between the third input of the differential comparator and the ground node; and a second capacitor that is coupled between the ground node and the output of the converter, wherein the differential comparator is arranged to receive a first half of a differential reference voltage at the first input of the differential comparator, and to receive a second half of the differential voltage at the second input of the differential comparator;

the differential comparator is arranged to provide a comparator output signal at the output of the differential comparator such that the comparator output signal is asserted if a voltage across the first capacitor reaches the differential reference voltage, and unasserted otherwise;

the logic gate is arranged to receive a first clock signal at the first input of the logic gate;

the second switch is arranged to receive a second clock signal at the control input of the second switch, wherein the first clock signal and the second clock signal are non-overlapping clock signals, and wherein the second clock signal has a frequency that is substantially the same as a frequency of the first clock signal;

the third switch is arranged to receive the second clock signal at the control input of the third switch; and wherein the fourth switch is arranged to receive the first clock signal at the control input of the fourth switch.

15. The circuit of claim 13, wherein the asymmetric charge pump includes a differential comparator that is arranged to compare a voltage across a first capacitor with a differential reference voltage.

16. The circuit of claim 15, wherein the asymmetric charge pump is arranged to receive non-overlapping clock signals that define a plurality of clock cycles that each have a first half of the clock cycle and a second half of the clock cycle, wherein the asymmetric charge pump is arranged to charge the first capacitor during the first half of the clock cycle while the voltage across the first capacitor is less than the differential reference voltage, and to cease charging the first capacitor if the voltage across the first capacitor reaches the differential reference voltage.

17. A method for audio amplification, comprising:

providing a positive power supply signal as a positive power supply for an audio amplifier, wherein the audio amplifier has a process voltage with a breakdown voltage;

converting the positive power supply signal into a negative power supply signal such that the negative power supply signal is opposite in polarity to the positive power supply signal and lesser in magnitude than the power supply signal, wherein double the positive supply signal is greater than the breakdown voltage, and such that the negative power supply signal is sufficiently smaller than in magnitude than the positive power supply signal that the positive power supply signal minus the negative power supply signal is less than the breakdown voltage; and providing the negative power supply signal as a negative power supply for the audio amplifier.

18. The method of claim 17, wherein converting the positive power supply signal into the negative power supply signal includes regulating the negative power supply signal to a regulated voltage level that is adjustable.

19. The method of claim 17, further comprising:

providing a differential reference voltage, wherein converting the positive power supply signal into the negative power supply signal includes regulating the negative power supply signal to a voltage that is substantially equal in magnitude to the differential reference voltage.

* * * * *